(12) United States Patent
Shibuya et al.

(10) Patent No.: US 9,099,968 B2
(45) Date of Patent: Aug. 4, 2015

(54) BIAS CONTROL CIRCUIT

(75) Inventors: Tomohiko Shibuya, Tokyo (JP); Atsushi Ajioka, Tokyo (JP); Atsushi Tsumita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 40 days.

(21) Appl. No.: 13/988,110

(22) PCT Filed: Jan. 17, 2012

(86) PCT No.: PCT/JP2012/050762
§ 371 (c)(1),
(2), (4) Date: May 31, 2013

(87) PCT Pub. No.: WO2012/117757
PCT Pub. Date: Sep. 7, 2012

(65) Prior Publication Data
US 2013/0328626 A1    Dec. 12, 2013

(30) Foreign Application Priority Data

Mar. 3, 2011  (JP) .................................. 2011-046919

(51) Int. Cl.
*H03G 3/20* (2006.01)
*H03F 1/26* (2006.01)
*H03F 1/02* (2006.01)
*H03F 3/19* (2006.01)
*H03F 3/24* (2006.01)
*H03F 1/32* (2006.01)

(52) U.S. Cl.
CPC ................ *H03F 1/26* (2013.01); *H03F 1/0222* (2013.01); *H03F 1/3205* (2013.01); *H03F 3/19* (2013.01); *H03F 3/245* (2013.01); *H03F 2200/102* (2013.01)

(58) Field of Classification Search
CPC .......................................................... H03F 1/26
USPC ......................................... 330/136, 297, 127
See application file for complete search history.

(56) References Cited

U.S. PATENT DOCUMENTS 6,492,867 B2 * 12/2002 Bar-David ...................... 330/10
2006/0220590 A1  10/2006 Tanabe et al.

FOREIGN PATENT DOCUMENTS

| CN | 1437793 A | 8/2003 |
|---|---|---|
| EP | 01 943 884.5 | 6/2001 |
| JP | A-2010-206545 | 9/2010 |

(Continued)

OTHER PUBLICATIONS

Written Opinion of the International Searching Authority issued in International Patent Application No. PCT/JP2012/050762 mailed Mar. 6, 2012 (with partial translation).

(Continued)

*Primary Examiner* — Khanh V Nguyen
*Assistant Examiner* — Khiem Nguyen
(74) *Attorney, Agent, or Firm* — Oliff PLC

(57) ABSTRACT

The problem to be solved is to alleviate the distortion characteristic of an amplifier and to prevent the drop in gain with respect to a low-level high-frequency signal. A bias control circuit (10) for controlling the bias of an amplifier (20) which amplifies a high-frequency signal is provided herein with a detector (11) for detecting the envelope of the high-frequency signal, a first bias circuit (12) for supplying a constant bias current to the amplifier (20) and a second bias circuit (14) for supplying a bias current that varies with the variation of the level of the envelope of the high-frequency signal to the amplifier.

18 Claims, 3 Drawing Sheets

(56) References Cited

FOREIGN PATENT DOCUMENTS

| | | |
|---|---|---|
| WO | 01/67593 A2 | 9/2001 |
| WO | WO 02/03545 A1 | 1/2002 |

OTHER PUBLICATIONS

Office Action issued in Japanese Patent Application No. 2011-046919 dated Feb. 8, 2013 (with translation).

* cited by examiner

BIAS CONTROL CIRCUIT

The present invention relates to a bias control circuit for controlling the bias of an amplifier.

BACKGROUND

As a multiple carrier transmission which utilizes the orthogonal frequencies, OFDM (orthogonal Frequency Division Multiplex) can efficiently take advantage of frequencies and has better performance in mitigating multipath distortion. Since the OFDM modulated wave has a high peak factor, if the back-off of the amplifier is not sufficient, the transmission quality will be degraded due to the nonlinear distortion of the amplifier or the disturbance to adjacent channels will be increased due to the elevated sidelobe level of the frequency spectrum. Further, in an operational amplifier of class A or class AB, the efficiency of the amplifier decreases as the back-off increases. Thus, an amplifying process is expected that the efficiency is not decreased even at the moment when the back-off is obtained. The envelope tracking is known as one of such amplifying processes. For example, JP2010-206545 has proposed a scheme in which the envelope of the input signals is detected and the bias voltage of the amplifier is changed depending on whether the level of the envelope has gone beyond the threshold. Besides, WO02/003545 has proposed a scheme in which the bias current of the amplifier is adjusted by a current mirror circuit according to the variation of the level of the envelope of input signal.

PATENT DOCUMENTS

Patent 1: JP2010-206545
Patent 2: WO02/003545

SUMMARY

As for the amplifying process described in JP2010-206545, if the amplifier comprises a bipolar transistor and the control to the bias voltage is not consistently provided, the collector current flows too much, leading to the degradation of the linearity of the amplifier. Furthermore, the circuit for controlling the bias voltage of the amplifier is a digital signal processor, so the circuit is quite complex and has large scale. On the other hand, with respect to the amplifying process described in WO02/003545, if the level of the envelope of the input signal is small, the bias current provided to the amplifier become quite small which will decrease the gain of the amplifier.

Thus, the present invention is to provide a bias control circuit capable of alleviating the distortion characteristic of the amplifier and also preventing the gain with respect to a low-level high-frequency signal from decreasing.

In order to solve the above-mentioned problem, the bias control circuit is provided herein. This bias control circuit controls the bias of the amplifier for amplifying a high-frequency signal and is provided with a detector for detecting the envelope of the high-frequency signal, a first bias circuit for supplying a constant bias current to the amplifier, and a second bias circuit for supplying a bias current that varies with the variation of the level of the envelope to the amplifier. As the first bias circuit provides a constant bias circuit to the amplifier even when the level of the high-frequency signal is low, the gain of the amplifier can be prevented from decreasing and a stable operation is ensured. Further, the bias circuit which varies with the variation of the level of the envelope of a high-frequency signal will be supplied to the amplifier, so the distortion characteristic of the amplifier can be alleviated.

Preferably, the first bias circuit supplies a constant bias current irrelevant to the level of the envelope to the amplifier. Thus, a bias circuit with a minimum value is supplied to the amplifier even when the level of the high-frequency is low. Thus, the gain of the amplifier can be prevented from decreasing and a stable operation is ensured.

Preferably, the second bias circuit supplies a bias current that varies with the variation of the level of the envelope to the amplifier when the level of the envelope goes beyond a threshold value. Thus, when the amplifier comprises a bipolar transistor, for instance, the quick variation of the collector current in response to the level variation of the envelope of the high-frequency signal can be inhibited, and the amplifier would keep its linearity.

The bias control circuit can also contain a reverse current prevention circuit interposed in each current path so as to supply the bias current from the first and second bias circuits to the amplifier. In this way, the reversed bias current between the first bias circuit and second bias circuit can be prevented.

The first bias circuit is preferably a current mirror circuit for supplying a bias current, which is irrelevant to the level of the envelope and is obtained by multiplying a reference current having a constant current value by a first mirror ratio. The second bias circuit is preferably a current mirror circuit for supplying a bias current which is obtained by multiplying a reference current value by a second mirror ratio when the level of the envelope goes beyond a threshold value, wherein the reference current varies with the variation of the level of the envelope. By the current mirror circuit, a bias current that changes with the variation of the level of envelope of the high-frequency signal will be easily generated based on the joint area ratio of the transistors, the resistance for adjusting the supply voltage or current and etc.

The detector, the first bias circuit and the second bias circuit are preferably connected in parallel to the amplifier. Such a circuit configuration is helpful to single chip integration of the bias control circuit.

The bias control circuit can further comprise a third bias circuit for supplying a bias current that varies with the variation of the level of the envelope to the amplifier. Thus, it is possible to precisely provide a bias current in which the distortion characteristic has been taken into consideration.

The bias control circuit of the present invention can alleviate the distortion characteristic of the amplifier and can also prevent the drop of gain with respect to the low-level high-frequency signal.

DETAILED DESCRIPTION OF EMBODIMENTS

Hereafter, the Examples of the present invention will be illustrated with reference to the figures. The same symbols are used in the same circuit, and the same descriptions will be omitted.

EXAMPLE 1

Figure 1:
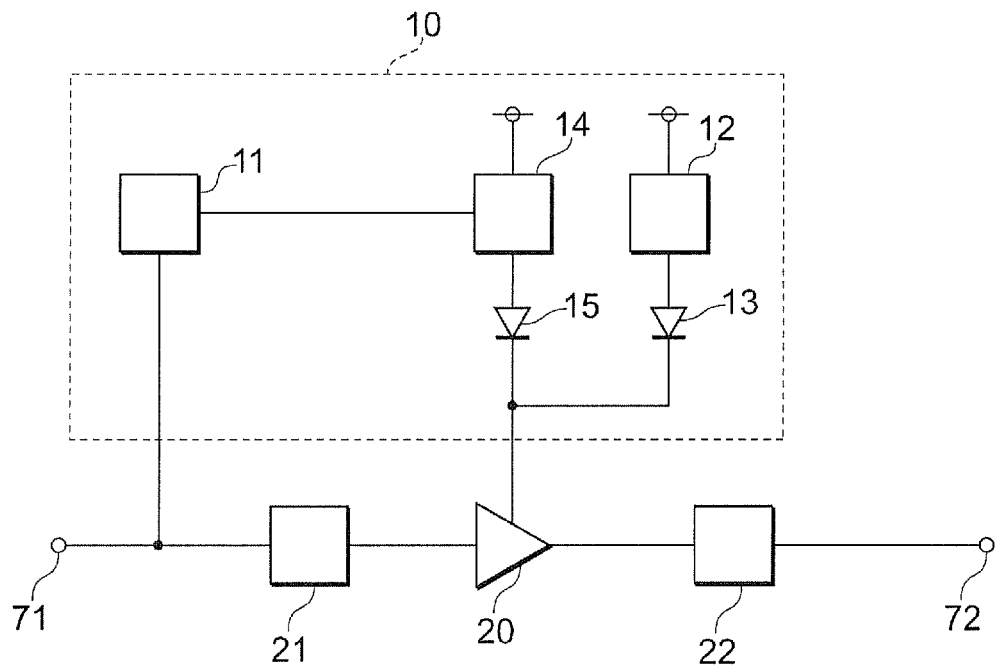
FIG. 1 is a block diagram showing the configuration of the bias control circuit of Example 1.

FIG. 1 is a block diagram showing the configuration of the bias circuit 10 of Example 1. The amplifier 20 is an amplifier for amplifying the power of the high-frequency signal (for example, the OFDM modulated signal) input from the input terminal 71 and then outputting the amplified power to the output terminal 72. Amplifier 20 comprises at least one bipolar transistors. A matching circuit 21 is arranged in the front stage of the amplifier 20 so as to match the impedance of the input signal source into the input impedance of the amplifier 20. And a matching circuit 22 is disposed in the back stage of the amplifier 20 so as to match the output impedance of the amplifier 20 into the load impedance. The bias control circuit 10 is a circuit for controlling the supply of the bias current of the amplifier 20. The bias control circuit 10 comprises a detector 11 for detecting the envelope of the high-frequency signal, a first bias circuit 12 for supplying a constant bias current to the amplifier 20 and a second bias circuit 14 for supplying a bias current that varies with the variation of the level (voltage) of the envelope to the amplifier 20. The detector 11, the first bias circuit 12 and the second bias circuit 14 are connected in parallel to the amplifier 20, which is helpful to the single chip integration of the bias control circuit 10. The detector 11 is a well known circuit for envelope detection. For example, the detector 11 comprises a detection element such as a diode as well as an smoothing circuit such as a capacitor.

Figure 2:
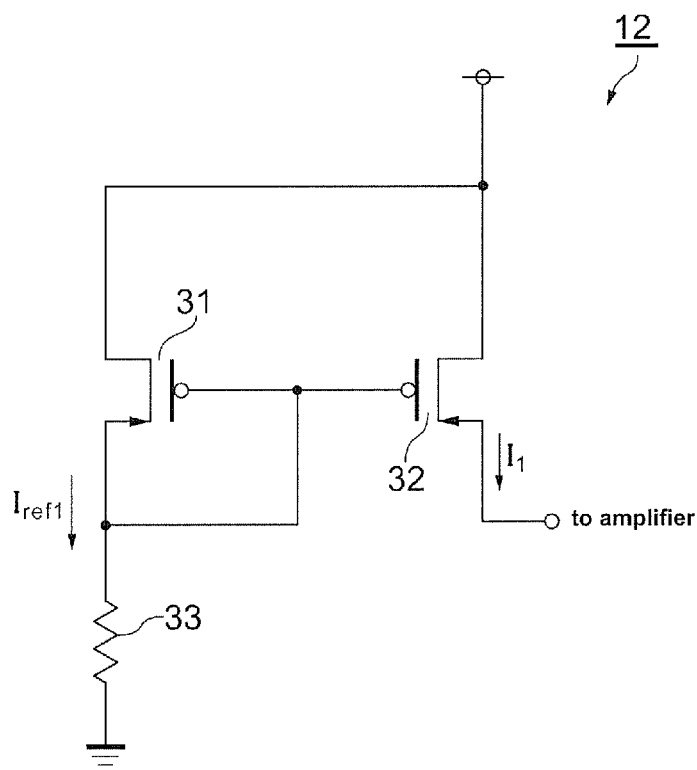
FIG. 2 is a circuit view showing the configuration of the first bias circuit of Example 1.

FIG. 2 is a circuit view showing the configuration of the first bias circuit 12. The first bias circuit 12 comprises an input transistor 31, an output transistor 32 and a resistance 33. As shown in the figure, the gate of the input transistor 31 is connected to the gate of the output transistor 32, and the drain of the input transistor 31 and the drain of the output transistor 32 are connected to the same power supply. Further, it is short circuited between the gate and the source of the input transistor 31, the resistance 33 is connected to the drain. The reference current $I_{ref1}$ flowing through the source of the input transistor 31 is irrelative to the level (voltage) of the envelope of the high-frequency signal, i.e., being constant, and is adjusted according to the supply voltage and the resistance 33. The current $I_1$ flowing though the source of the output transistor 32 has a current value obtained by multiplying the reference current $I_{ref1}$ with a first mirror ratio and is supplied to the amplifier 20 as a constant bias current. The first mirror ratio can be adjusted based on the joint area ratio of the transistor 31,32.

Figure 3:
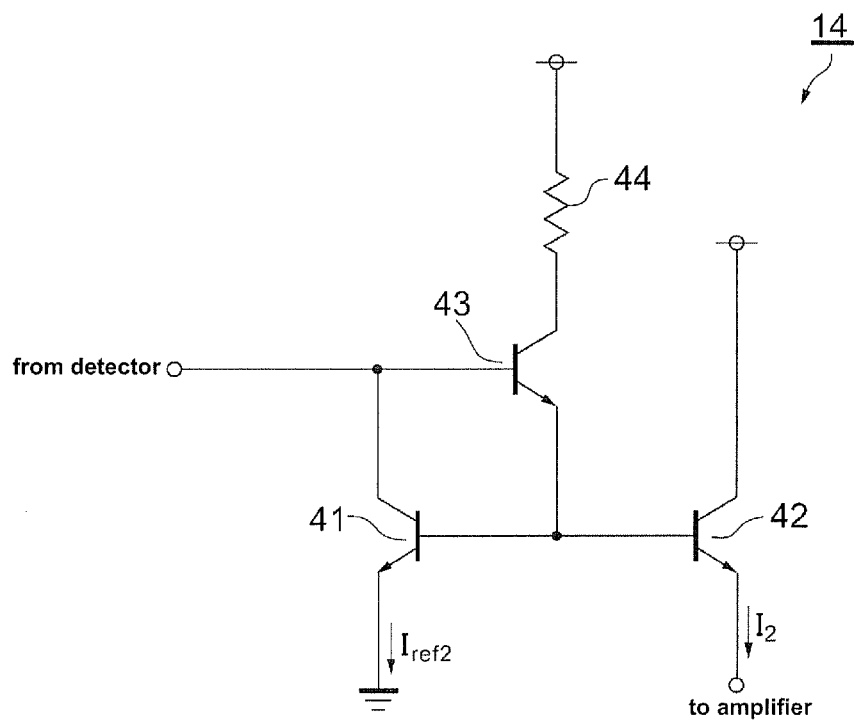
FIG. 3 is a circuit view showing the configuration of the second bias circuit of Example 1.

FIG. 3 is a circuit view showing the configuration of the second bias circuit 14. The second bias circuit 14 is a current mirror circuit comprising an input transistor 41, an output transistor 42, a switching transistor 43 and a resistance 44. As shown in the figure, the collector of the switching transistor 43 is connected to the power supply via the resistance 44. The base is connected to the output of the detector 11 and the emitter is connected to the base of the input transistor and the base of the output transistor 42. In addition, the collector of the input transistor 41 is connected to the base of the switching transistor 43, and the collector of the output transistor 42 is connected to the power supply. The switching transistor 43 is opened when the level of the envelope of the high-frequency signal which is input to the base is higher than the first threshold voltage Vth1, and it is closed when the level of the envelope of the high-frequency signal is below the first threshold voltage Vth1. The value for the first threshold voltage Vth1 is preferred to be one which makes the switching transistor 43 become open when the degradation of distortion characteristic of the amplifier 20 is about to occur or before the above-mentioned moment comes (about 1-3 dB). If the switching transistor 43 becomes open, as the base current of the input transistor 41 changes as the level of the envelope of the high-frequency signal varies, the reference current $I_{ref2}$ flowing through the emitter of the input transistor 41 also changes as the level of the envelope of the high-frequency signal varies. The current $I_2$ flowing through the emitter of the output transistor 42 has a value obtained by multiplying the reference current $I_{ref2}$ with a second mirror ratio and is supplied to the amplifier 20 as a bias current which changes with the variation of the level of the envelope of the high-frequency signal. The second mirror ratio may be adjusted according to the joint area ratio of the transistor 41,42.

Figure 4:
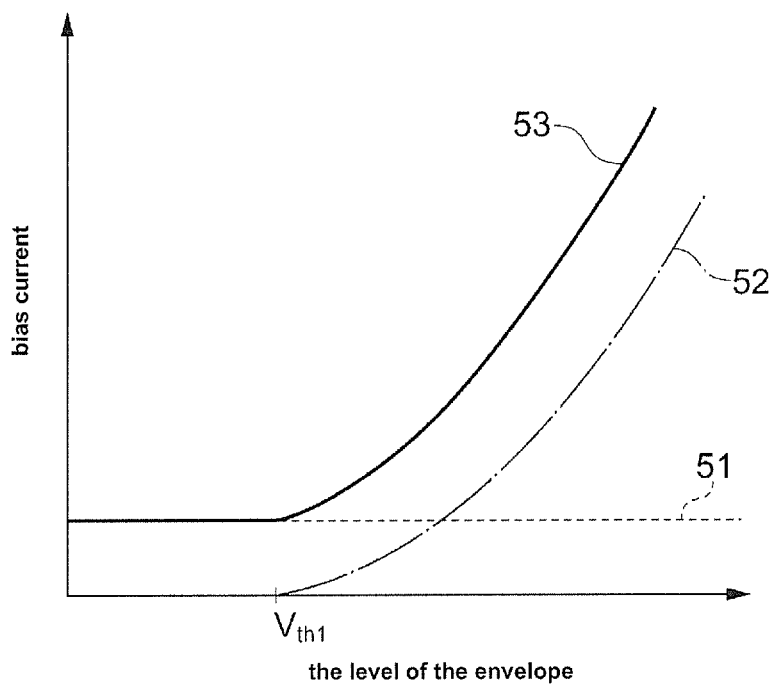
FIG. 4 is a graph showing the operation of the bias control circuit of Example 1.

FIG. 4 is a graph showing the operation of the bias control circuit 10, wherein the horizontal axis represents the signal level of the envelope of the high-frequency signal and the vertical axis represents the bias current. Symbols 51 and 52 respectively represent the bias currents $I_1$ and $I_2$ shown in FIGS. 2 and 3. Symbol 53 represents the whole bias current supplied from the bias control circuit 10 to the amplifier 20. The bias current 53 is the combination of bias currents 51 and 52. As shown in the figures, when the level of the envelope of the high-frequency signal is below the first threshold voltage Vth1, a constant bias current 51 is stably supplied to the amplifier 20, so the gain drop of the amplifier 20 with respect to the low-level high-frequency signal can be prevented and the power consumption will become low. On the other hand, if the level of the envelope of the high-frequency signal is higher than the first threshold voltage Vth1, the bias current 52 increasing with the increase of the level of the envelope of the high-frequency signal is added to the constant current 51 and is supplied to the amplifier 20 together, so the distortion characteristic of the amplifier 20 can be alleviated. Further, the quick change of the collector current of the amplifier 20 in response to the level variation of the envelope of the high-frequency signal can be prevented and the linearity of the amplifier 20 will be maintained.

Besides, as shown in FIG. 1, the diodes 13 and 15 used as the reverse current prevention circuits are preferably interposed into each current path that supplies the bias current from the first and second bias circuits 12,14 to the amplifier 20. Thus, the reversed bias current between the first bias circuit 12 and the second bias circuit can be inhibited. The reverse current prevention circuit is not limited to the diodes 13,15. It can also be a transistor. In addition, the first and second bias circuits 12,14 are not limited to the current mirror circuits. For instance, the emitter follower can be used as well.

EXAMPLE 2

Figure 5:
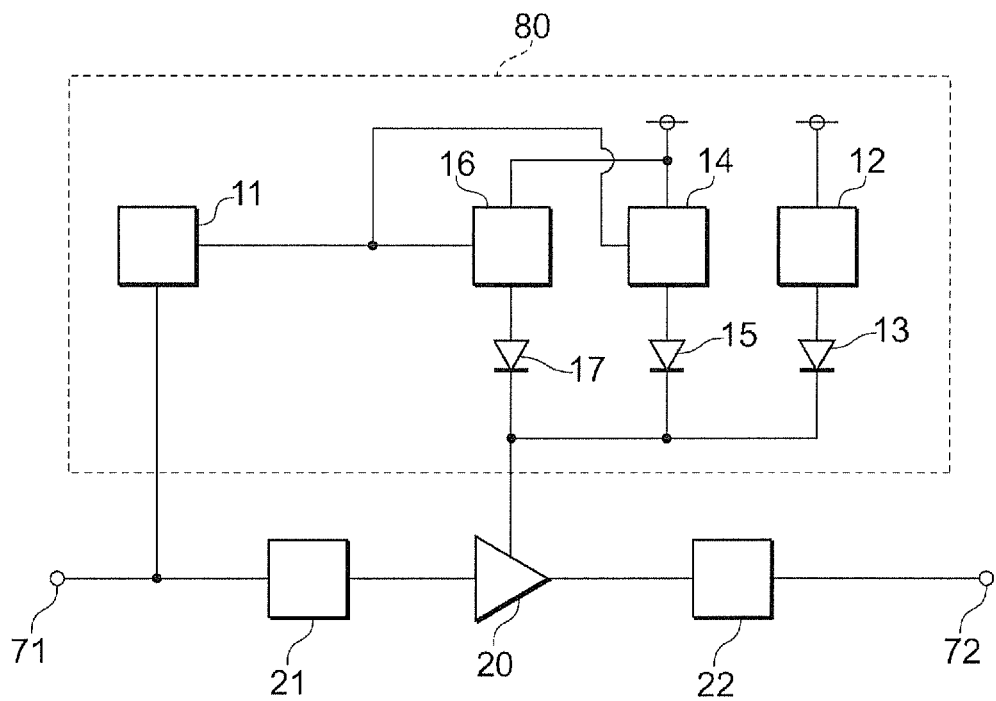
FIG. 5 is a block diagram showing the configuration of the bias control circuit of Example 2.

FIG. 5 is a block diagram showing the configuration of the bias control circuit 80 of Example 2. The bias control circuit 80 is almost the same as the bias control circuit 10 of Example 1 except that the bias control circuit 80 comprises a third bias circuit 16 for supplying the bias current which changes with the variation of the level of the envelope of the high-frequency signal to the amplifier 20 and a diode 17 as a reverse current prevention circuit interposed in a current path for supplying the bias current from the third bias circuit 16 to the amplifier 20. The third bias circuit 16 is a current mirror circuit having the same configuration as that of the second bias circuit 14.

The third bias circuit 16 supplies a bias current to the amplifier 20 when the level of the envelope of the high-frequency signal is higher than a second threshold voltage Vth2, and the third bias circuit 16 stops the supply of a bias current to the amplifier 20 when the level of the envelope of the high-frequency signal is below the second threshold voltage Vth2. Preferably, the second threshold voltage Vth2 is higher than the first threshold voltage Vth1 and is arranged to supply the bias current from the third bias circuit 16 to the amplifier 20 before any degradation of distortion characteristic happens to the amplifier 20.

Figure 6:
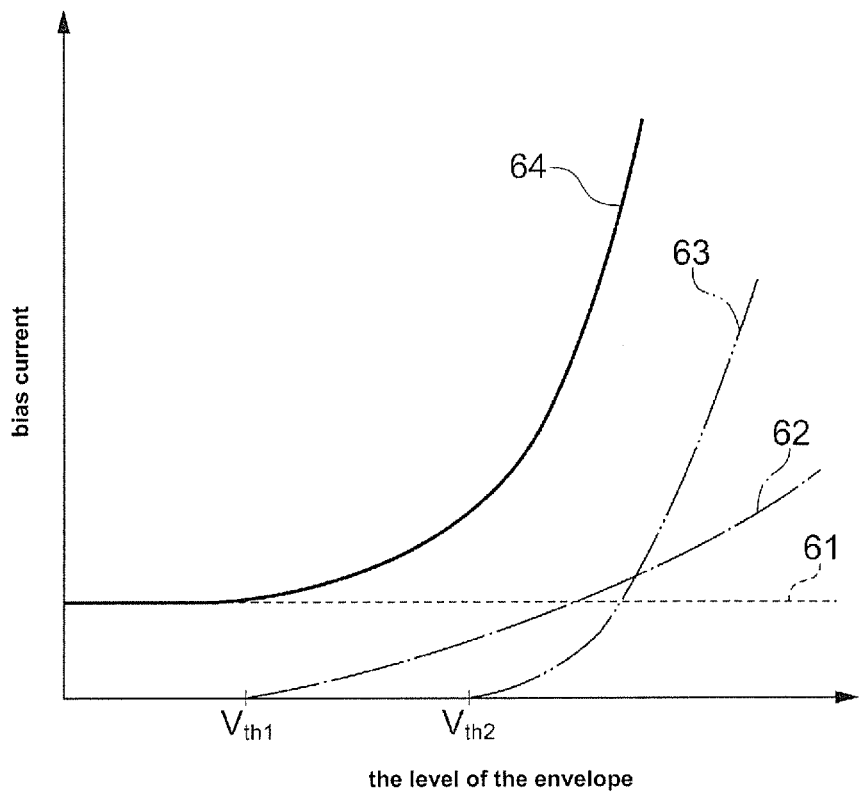
FIG. 6 is a graph showing the operation of the bias control circuit of Example 2.

FIG. 6 is a graph showing the operation of the bias control circuit 80, wherein the horizontal axis represents the signal level of the envelope of the high-frequency signal and the vertical axis represents the bias current. Symbols 61, 62 and 63 respectively represents part of the bias currents supplied from the first, second and third bias circuits 12, 14 and 16 to the amplifier 20. Symbol 64 represents the whole bias current supplied from the bias control circuit 10 to the amplifier 20. The bias current 64 is the sum of the bias currents 61, 62 and 63. As shown in this figure, when the level of the envelope of the high-frequency signal is below the first threshold voltage Vth1, a constant bias current 61 is stably supplied to the amplifier 20, so the drop of the gain of the amplifier 20 with respect to the low-level high-frequency signal can be prevented and the power consumption will become lowered. On the other hand, when the level of the envelope of the high-frequency is higher than the first threshold voltage Vth1, the bias current 62 which increases with the variation of the level of the envelope of the high-frequency signal is added to the constant bias current 61 and is supplied to the amplifier 20 together, so the distortion characteristic of the amplifier 20 can be alleviated. When the level of the envelope of the high-frequency signal is higher than the second threshold voltage Vth2, the bias current 63 increasing as the level of the envelope of the high-frequency signal increases is added to the bias currents 61 and 62 and is supplied to the amplifier 20 together. The changing rate (the slopes in the graph) of each of bias currents 62 and 63 corresponding to the level of the envelope of the high-frequency signal can be respectively adjusted based on the mirror ratio of the second and third bias circuits 14 and 16, so it is possible to precisely provide a bias current in which the distortion characteristic of the amplifier 20 is taken into consideration. For example, the changing rate of the bias current 63 corresponding to the variation of the level of the envelope of the high-frequency signal can be greater than the changing rate of the bias current 62. Thus, a necessary and ideal bias current is supplied to the amplifier 20 to keep the linearity of the amplifier 20 by combining the bias circuits 14,16 which differ in their changing rates of the bias current corresponding to the change of the level of the envelope of the high-frequency signal. Such a combination is efficient when only the bias circuit 14 fails to provide the necessary and ideal bias current that keeps the linearity of the amplifier 20.

Furthermore, the third bias circuit 16 is not limited to the current mirror circuit. It can be an emitter follower, for example. And the bias control circuit 80 can also contains three or more bias circuits for supplying bias currents that changes with the variation of the level of the envelope of the high-frequency signal to the amplifier 20.

The present invention is useful to the circuit for controlling the bias of an amplifier which requires linearity.

DESCRIPTION OF REFERENCE NUMERALS

10. Bias control circuit
11. Detector
12. First bias circuit
13. Diode
14. Second bias circuit
15. Diode
16. Third bias circuit
17. Diode
20. Amplifier
21, 22 Matching circuits
31. Input transistor
32. Output transistor
33. Resistance
41. Input transistor
42. Output transistor
43. Switching transistor
44. Resistance
71. Input terminal
72. Output terminal

What is claimed is:

1. A bias control circuit for controlling bias of an amplifier for amplifying a high-frequency signal, provided with:
   a detector for detecting an envelope of the high-frequency signal,
   a first bias circuit for supplying a constant bias current to the amplifier,
   a second bias circuit for supplying a bias current that varies with variation of a level of the envelope to the amplifier, and
   a reverse current prevention circuit, interposed in each current path for supplying the bias current from the first and second bias circuit to the amplifier.

2. The bias control circuit of claim 1, wherein,
   the first bias circuit supplies the constant bias current irrelevant to the level of the envelope to the amplifier.

3. The bias control circuit of claim 1, wherein,
   the second bias circuit supplies the bias current that varies with the variation of the level of the envelope to the amplifier when the level of the envelope goes beyond a threshold value.

4. The bias control circuit of claim 1, wherein,
   the first bias circuit is a current mirror circuit for supplying the bias current, which is irrelevant to the level of the envelope and is obtained by multiplying a reference current having a constant current value by a first mirror ratio, and
   the second bias circuit is a current mirror circuit for supplying the bias current which is obtained by multiplying a reference current value by a second mirror ratio when the level of the envelope goes beyond a threshold value, wherein said reference current varies with the variation of the level of the envelope.

5. The bias control circuit of claim 1, wherein,
   the detector, the first bias circuit and the second bias circuit are connected in parallel to the amplifier.

6. The bias control circuit of claim 1, further provided with:
   a third bias circuit for supplying a bias current that varies with the variation of the level of the envelope to the amplifier.

7. A bias control circuit for controlling bias of an amplifier for amplifying a high-frequency signal, provided with:
   a detector for detecting an envelope of the high-frequency signal,
   a first bias circuit for supplying a constant bias current to the amplifier, and
   a second bias circuit for supplying a bias current that varies with variation of a level of the envelope to the amplifier, wherein, the first bias circuit is a current mirror circuit for supplying the bias current, which is irrelevant to the level of the envelope and is obtained by multiplying a reference current having a constant current value by a first mirror ratio, and the second bias circuit is a current mirror circuit for supplying the bias current which is obtained by multiplying a reference current value by a second mirror ratio when the level of the envelope goes beyond a threshold value, wherein said reference current varies with the variation of the level of the envelope.

8. The bias control circuit of claim 7, wherein,
the first bias circuit supplies the constant bias current irrelevant to the level of the envelope to the amplifier.

9. The bias control circuit of claim 7, wherein,
the second bias circuit supplies the bias current that varies with the variation of the level of the envelope to the amplifier when the level of the envelope goes beyond a threshold value.

10. The bias control circuit of claim 7, further provided with:
a reverse current prevention circuit, interposed in each current path for supplying the bias current from the first and second bias circuit to the amplifier.

11. The bias control circuit of claim 7, wherein,
the detector, the first bias circuit and the second bias circuit are connected in parallel to the amplifier.

12. The bias control circuit of claim 7, further provided with:
a third bias circuit for supplying a bias current that varies with the variation of the level of the envelope to the amplifier.

13. A bias control circuit for controlling bias of an amplifier for amplifying a high-frequency signal, provided with:
a detector for detecting an envelope of the high-frequency signal,
a first bias circuit for supplying a constant bias current to the amplifier,
a second bias circuit for supplying a bias current that varies with variation of a level of the envelope to the amplifier, and
a third bias circuit for supplying a bias current that varies with the variation of the level of the envelope to the amplifier.

14. The bias control circuit of claim 13, wherein, the first bias circuit supplies the constant bias current irrelevant to the level of the envelope to the amplifier.

15. The bias control circuit of claim 13, wherein,
the second bias circuit supplies the bias current that varies with the variation of the level of the envelope to the amplifier when the level of the envelope goes beyond a threshold value.

16. The bias control circuit of claim 13, further provided with:
a reverse current prevention circuit, interposed in each current path for supplying the bias current from the first and second bias circuit to the amplifier.

17. The bias control circuit of claim 13, wherein,
the first bias circuit is a current mirror circuit for supplying the bias current, which is irrelevant to the level of the envelope and is obtained by multiplying a reference current having a constant current value by a first mirror ratio, and the second bias circuit is a current mirror circuit for supplying the bias current which is obtained by multiplying a reference current value by a second mirror ratio when the level of the envelope goes beyond a threshold value, wherein said reference current varies with the variation of the level of the envelope.

18. The bias control circuit of claim 13, wherein,
the detector, the first bias circuit and the second bias circuit are connected in parallel to the amplifier.

* * * * *